United States Patent [19]

Norioka

[11] Patent Number: 4,990,778
[45] Date of Patent: Feb. 5, 1991

[54] SCANNING ELECTRON MICROSCOPE
[75] Inventor: Setsuo Norioka, Tokyo, Japan
[73] Assignee: JEOL Ltd., Tokyo, Japan
[21] Appl. No.: 413,825
[22] Filed: Sep. 28, 1989
[30] Foreign Application Priority Data
   Sep. 30, 1988 [JP] Japan .................... 63-247093
[51] Int. Cl.⁵ .................... H01J 37/256; H01J 37/28
[52] U.S. Cl. .................... 250/310; 250/397
[58] Field of Search .................... 250/310, 397, 311
[56] References Cited
   U.S. PATENT DOCUMENTS
   3,783,281  1/1974  Crewe .................... 250/311
   4,588,891  5/1986  Saito .................... 250/310

Primary Examiner—Jack I. Berman
Attorney, Agent, or Firm—Webb, Burden, Ziesenheim & Webb

[57] ABSTRACT

In a field emission gun, current intensity of the electron beam passing through the gun anode contains a fluctuation component due to the ion bombardment and ion absorption near the emitter tip. For this reason, a scanning electron microscope having a field emission gun usually incorporates a fluctuation compensation device, which generates the signal ratio of the secondary electron signal from a specimen irradiated by the electron beam and the monitor signal corresponding to the current intensity of the electron beam passing through the gun anode and supplies the signal ratio for brightness modulation signal to the scanning image display means of the microscope. However, if the electron beam intensity is varied in a very wide operating range, the conventional fluctuation compensation device cannot operate with enough compensation effect. In this invention, the signal level of the monitor signal is maintained constant, so that the fluctuation correction device operates with enough compensation effect for a wide operating range of electron beam intensity.

4 Claims, 3 Drawing Sheets

SCANNING ELECTRON MICROSCOPE

BACKGROUND OF THE INVENTION

This invention relates to an improved scanning electron microscope (hereinafter called SEM) having a field emission gun (hereinafter called FEG) and more particularly relates to a device for correcting the influence of the current fluctuation of an electron beam in a SEM having FEG (hereinafter called FE-SEM).

As is well know, the electron beam brightness of the virtual source formed by a FEG is considerably higher than that of a thermal emission electron gun. In FEG, an emitter tip is maintained at a voltage V0 for accelerating or decelerating; the electron beam emitted from between the emitter tip and an anode maintained at ground potential. An extraction electrode facing the emitter tip is maintained at extraction voltage V1 for forming the strong electric field near the emitter tip. The extraction voltage V1 is so adjusted that optimum field emission at the emitter tip is carried out. The position of the virtual source of FEG is varied according to the electrostatic lens field formed between the anode and the extraction electrode. For example, under the condition of V0<V1, the position of the virtual source is shifted along the optical axis far away from the anode by increasing the acceleration voltage V0 or voltage ratio r (=V0/V1). Thereby, the current intensity of the electron beam passing through the anode increases as the distance between the virtual source and the anode increases.

On the other hand, in a FEG, the current intensity of the electron beam is apt to fluctuate under the influence of the frequent absorption and desorption of residual gas molecules or ion bombardment of the surface of the emitter tip. Consequently, the current intensity of the electron beam passing through the anode consists of a constant component and a fluctuation (or noise) component. The current fluctuation of the electron beam irradiating a specimen causes noise to form in the output signal of the detector which detects the secondary electrons yielded from the specimen. The noise in the output signal of the detector causes a brightness fluctuation in a normal microscope image displayed in a SEM, and causes to flicker noise in the scanning image. Because of this, an ordinary FE-SEM incorporates a compensation device for detecting the fluctuation of the electron beam and compensating the influence of the fluctuation component of the electron beam included in the secondary electron signal from a specimen. This type of compensation device in the FE-SEM is disclosed in U.S. Pat. No. 3,783,281. This device provides sufficient compensating effect in the cases where an acceleration voltage for the electron beam is in a narrow operating range, e.g., 5 kV −30 kV, and where an electron beam current detected as a monitor signal is as large as, for example $1 \times 10^{-9}$ Amperes or more.

Recent cases of observing and analyzing various materials require the acceleration voltage V0 to be in a wide operating range of 0.5 kV−50 kV. In the cases, the current intensity of the electron beam is also varied within a very wide range, e.g., $1 \times 10^{-8}$ Amperes $- \times 10^{-10}$ Amperes. However, when the input signal indicating the fluctuation of the electron beam is over or under the critical value within said wide range, the frequency characteristic of the conventional compensation device deteriorates or the output of the conventional compensation device saturates. For this reason, the conventional compensation device cannot provide sufficient compensating effect when accelerating voltage is changed in said wide range. The FE-SEM for resolving this problem is described in U.S. Pat. No. 4,588,891. In this type of device, two detecting means for detecting current of the electron beam are disposed at different positions in the optical system in SEM and either one of the two means is selectively used according to the accelerating voltage. However, this type of device increases cost of manufacture and intricacy of maintenance and adjustment.

SUMMARY OF THE INVENTION

It is an object of the present invention to provide a FE-SEM in which sufficient fluctuation compensating effect is obtained by using only a single detecting means for detecting current intensity of an electron beam.

In order to accomplish this object, the FE-SEM according to the invention incorporates an emitter tip maintained at voltage V0 for accelerating an electron beam emitted from the emitter tip; an anode is maintained at ground potential; an extraction electrode is maintained at voltage V1, being arranged between the emitter tip and the anode. A fluctuation detecting means for detecting the current intensity of the electron beam passed through the anode by using the detecting element is arranged between the anode and a specimen to be irradiated by the electron beam and generates the signal E(r).

A signal processing means amplifies the signal E(r) so that the signal level of its amplified signal is maintained at constant level when the ratio V0/V1 is varied. An electron optical system focuses the electron beam passed through the anode and scans the electron beam over the specimen surface.

A detector detects the signal from the specimen caused by the electron beam scanning. A display means in synchronization with the electron beam scanning displays a scanning electron image. The signal for modulating the electron beam of the display corresponds to the ratio of the output signal of the detector and the output of the signal processing means.

DESCRIPTION OF THE PREFERRED EMBODIMENTS

Figure 1:
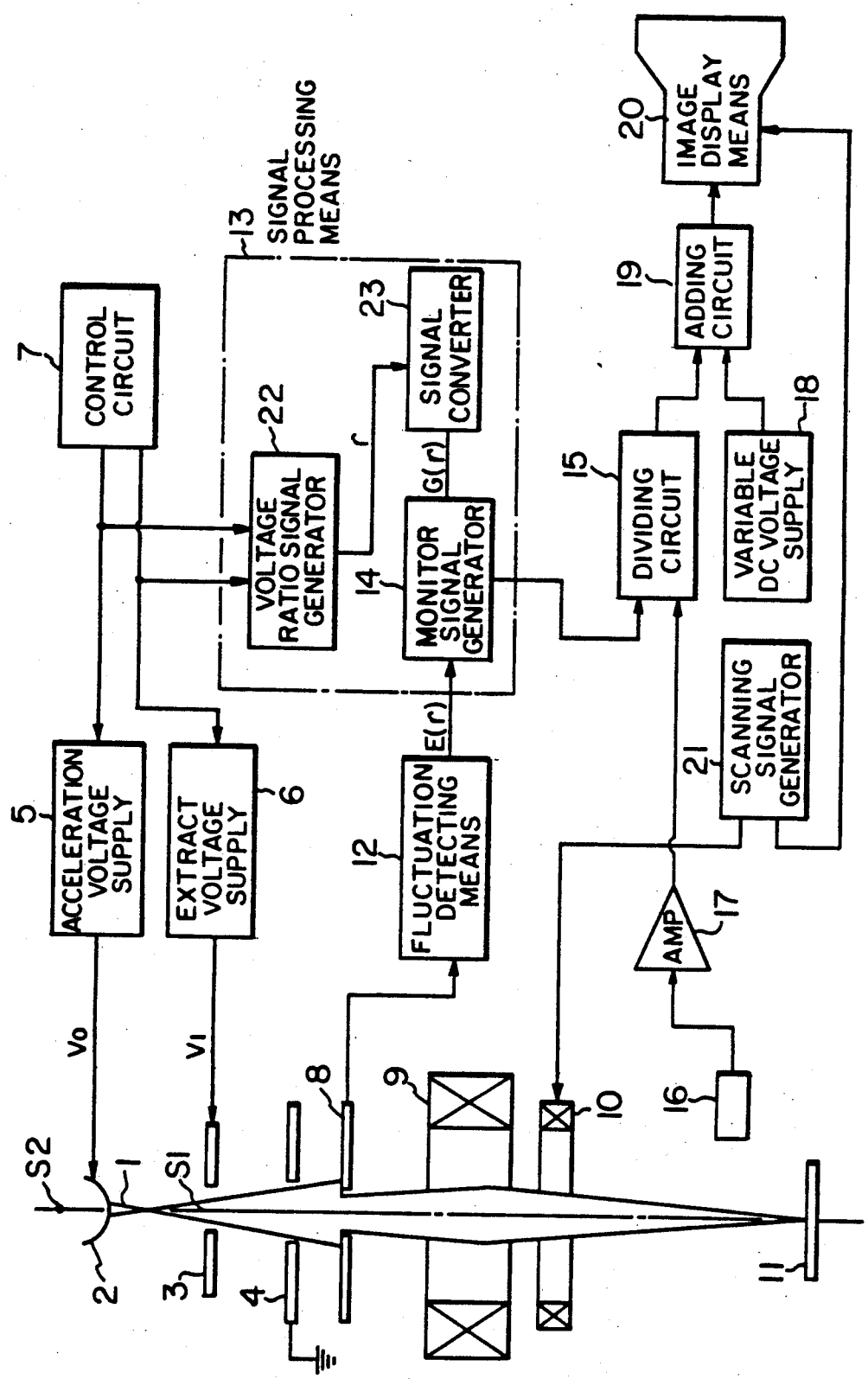
FIG. 1 is a schematic diagram of one embodiment according to the invention.

FIG. 1 shows schematically one embodiment according to the invention. The field emission gun comprises an emitter tip 1, tungsten filament supporting tip 2, an extraction electrode 3, and an anode 4 at ground potential. An acceleration voltage supply 5 applies the voltage V0 to the emitter tip 1. Extraction electrode 3 is maintained at voltage V1 by an extraction voltage supply 6 and is located between the emitter tip 1 and the anode 4. A control circuit 7 controls the output voltage V0 of the acceleration voltage supply 5 and the output voltage V1 of the extraction voltage supply 6.

The electron beam passes through the anode 4 and is focused by the focusing lens 9 on a specimen 11 and is scanned over the surface of the specimen 11 by a deflecting element 10. Part of the electron beam passed along the optical axis of SEM irradiates the aperture plate 8 located between the anode 4 and the specimen 11.

The absorbed electron beam current at the aperture plate 8 is converted to voltage signal and amplified by fluctuation detecting means 12. The output signal E(r) of the fluctuation detecting means 12 is applied to one of the input terminals of a dividing circuit 15 via monitor signal generator 14 forming part of signal processing means 13 as a denominator of the division calculation. The secondary electrons yielded from the specimen 11 caused by electron beam irradiation are detected by secondary electron detector 16 and amplified by video signal amplifier 17. The dividing circuit 15 outputs the ratio of the output signal of the amplifier 17 and the output signal of the monitor signal generator 14. The output signal of the dividing circuit 15 is added to the output signal of variable DC voltage supply 18 as a brightness control means and then applied to image display means 20 such as a CRT as a brightness modulation signal. The image scanning of image display means 20 is controlled by scanning signal generator 21 which also controls the deflecting element 10 in synchronization with the scanning of the image display means 20. As a result, the secondary electron microscope image of the specimen is displayed on the image display means 20. If a backscattered electron detector or cathodoluminesrence detector is used instead of the secondary electron detector, the backscattered electron image or cathodoluminescence image of the specimen is displayed on the image display means 20.

In the conventional FE-SEM, the output signal E(r) of the fluctuation detecting means 12 is applied to one of the input terminals of dividing circuit 15 directly, so that the scanning image without brightness fluctuation (or noise) due to the fluctuation of the intensity of the electron beam passed through the anode is obtained. However, the dividing circuit 15 in the ordinary FE-SEM cannot often operate normally because of the wide operating range of the input signal applied from the monitor signal generator 14.

On the contrary, in the embodiment shown in FIG. 1, the signal processing means 13 is incorporated between the fluctuation detecting means 12 and the dividing circuit 15. The signal processing means 13 maintains the level of the signal applied to the dividing circuit 15 at constant value and consists of the monitor signal generator 14 and a voltage ratio signal generator 22, which generates the ratio signal r of voltage V0 and voltage V1 by receiving the control signal for voltage V0 and V1 from the control circuit 7, and a signal convertor 23.

Figure 2:
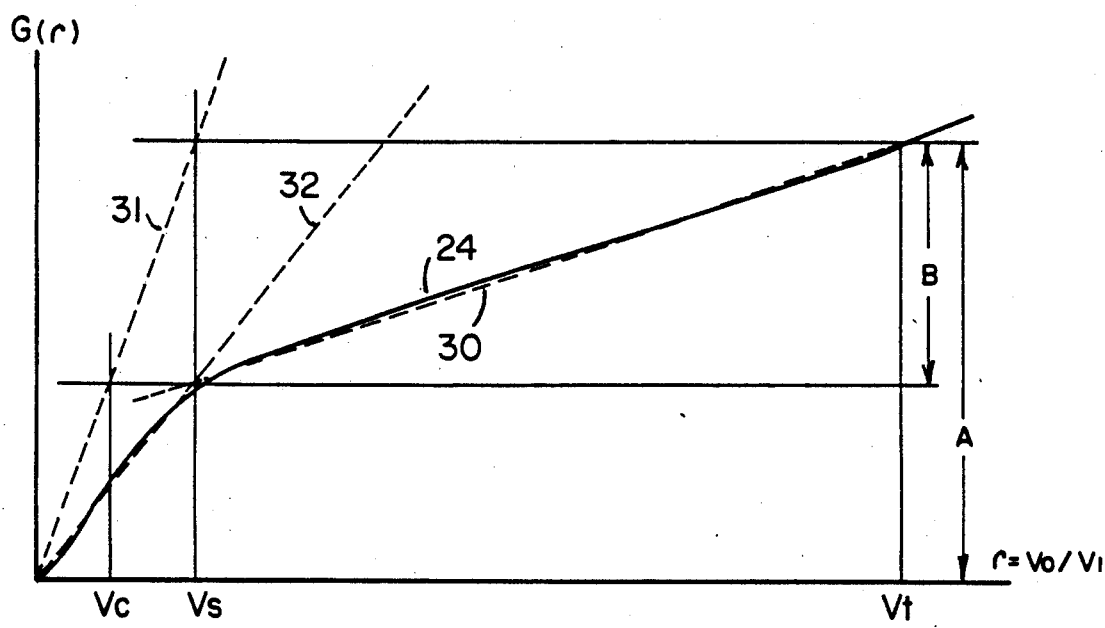
FIG. 2 is a schematic diagram for explaining the function of the embodiment of FIG. 1.
Figure 3:
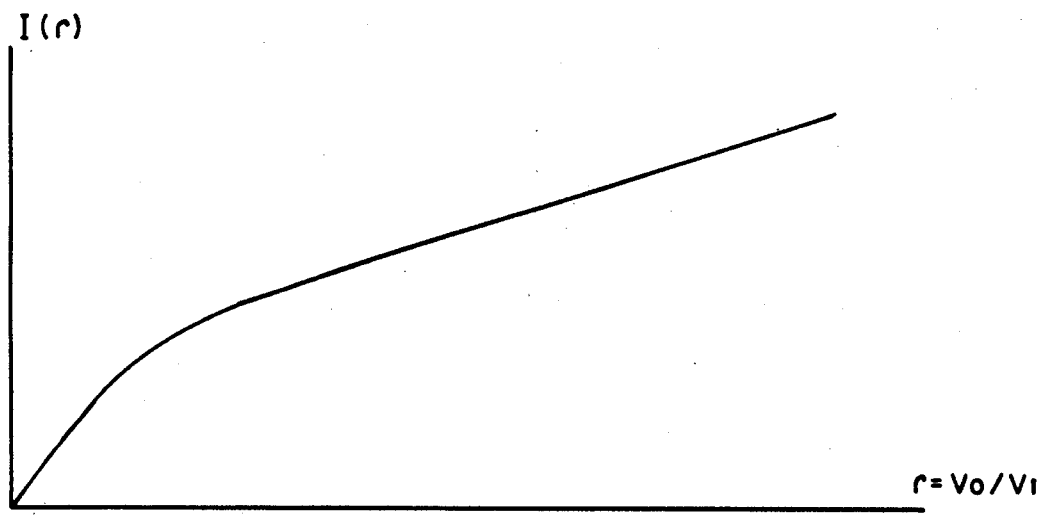
FIG. 3 is an example diagram showing the relation between the voltage of the field emission gun and intensity of the electron beam detected by detecting means.

The relation between input signal r and output signal G(r) of signal converter 23 is illustrated in FIG. 2. In FIG. 2, the ordinate indicates the voltage ratio r (=V0/V1) and abscissa indicates the output signal G(r) of the signal converter 23. The curve 24 showing G(r) is similar with respect to the curve 25 in FIG. 3, in which the curve 25 indicates the signal level I(r) of the electron beam current detected by detecting means as a function of voltage ratio r. The relation of $G(r) = \alpha \cdot I(r)$, where $\alpha$ is constant, is satisfied. The function I(r) is measured by using FE-SEM, because the fluctuation component contained in the output signal E(r) of the fluctuation detecting means 12 is about 10% of the total output signal of the fluctuation detecting means 12. In this measurement, the voltage V0 or voltage ratio r is varied gradually, so that the virtual source shifts between S1 and S2 on the optical axis. The shift of the virtual source causes increase or decrease of the electron beam passing through the anode. At each value of r, signal level I(r) of the intensity E(r) of the detected electron beam passing through the anode is measured by the aperture plate 8 and the fluctuation detecting means 12 and is stored. The signal converter 23 has previously stored these data and converted input signal r to the output signal $G(r) (= \alpha \cdot I(r))$.

Consequently, by calculating the ratio of E(r) and G(r) from the signal converter 23, monitor signal generator 14 generates a monitor signal representing the fluctuation of the electron beam. And signal level of the ratio of E(r) and G(r) is maintained constant regardless of the ratio signal r. As a result, the high quality scanning image without brightness fluctuation is obtained in this embodiment by operating normally the dividing circuit 17 regardless of the signal r value.

In case the output signal range 'A', shown in FIG. 2, of the signal convertor 23 exceeds the input signal range 'B' in which dividing circuit 15 can operate normally, the embodiment of FIG. 1 cannot compensate noise in the range (Vc<r<Vs) of voltage ratio r. In this case, following another embodiment of the invention is necessary.

Figure 4:
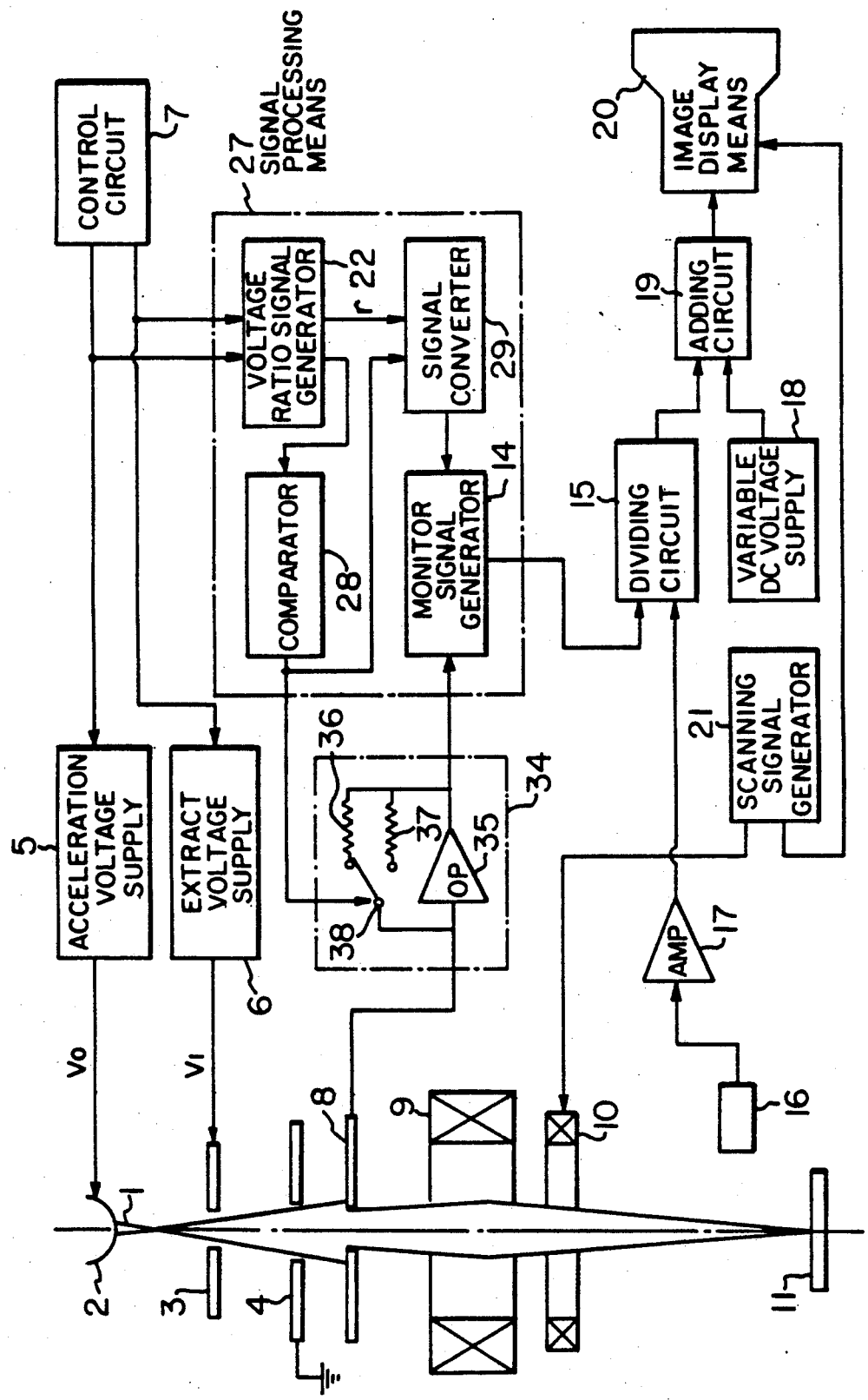
FIG. 4 is a schematic diagram of another embodiment of the invention.

Referring to FIG. 4, another FE-SEM embodying the concept of the invention is schematically shown. It is noted that like components are indicated by like reference numerals. In this embodiment, signal processing means 27 operates normally within the range of Vc<r<Vt shown in FIG. 2, while the dividing circuit 15 operates normally within the range 'B'. Signal processing means 27 incorporates comparator 28 for comparing the output signal r with the reference value Vs in FIG. 2. One of the output signals of the comparator 28 is supplied to signal converter 29. Signal converter 29 stores the function $G1(r) (= \alpha 1 \cdot I(r)$, where $\alpha 1$ is constant) shown as broken straight line 30 similar to curve 24 in the range (Vs<r<Vt) and function $G2(r) (= \alpha 2 \cdot I(r)$, where $\alpha 2 (= k \cdot \alpha 1)$ and k are constant), shown as broken line 31 in the range (Vc<r<Vs) in FIG. 2. The broken line 31 has higher inclination than that of broken line 32 similar to curve 24 by k times. Consequently, the output signal range of the signal converter 29 is reduced to the range 'B' shown in FIG. 2 when the input signal r varies from Vc to Vs. Incidentally, another output signal of comparator 28 is supplied to the fluctuation detecting means 34 which consists of an operational amplifier 35, converting resistors 36, 37 and changeover switching means 38. The output signal of the comparator 28 controls the changeover switching means 38 which changeovers the converting resistor 31 or 32, so that fluctuation detecting means 34 generates output signal E1(r) in the range (Vs<r<Vt) and generates output signal E2(r) in the range (Vc<r<Vs). The relation of $E2(r) = k \cdot E1(r)$ is satisfied by selecting the resistance of the resistor 31 and 32. As a result, the signal level of the output signal of the monitor signal generator 14, which generates signal ratio of E1(r) and G1(r) or the signal ratio of E2(r) and G2(r), is maintained at constant level, while the signal ratio extends from Vc to Vt. By applying the concept of the embodiment shown in FIG. 4, the scanning image without brightness fluctuation is obtained under the condition of the very wide operating range of the voltage ratio r.

Having thus described my invention with the detail and particularity required by the Patent Laws, what is claimed and desired to be protected by Letters Patent is set forth in the following claims.

What is claimed is:

1. A scanning electron microscope comprising:
   (a) an emitter tip maintained at voltage V0 for accelerating an electron beam emitted from the emitter tip;
   (b) an anode maintained at ground potential;
   (c) extraction electrode maintained at voltage V1 being arranged between the emitter tip and the anode;
   (d) fluctuation detecting means for detecting the current intensity of the electron beam passing through the anode by using a detecting element arranged between the emitter tip and a specimen to be irradiated by the electron beam and generating the signal E(r);
   (e) a signal processing means for processing the signal E(r) so that the processed signal level is maintained at a constant level when the ratio of V0/V1 is varied;
   (f) an electron optical system for focusing the electron beam passing through the anode and scanning the electron beam over the specimen surface;
   (g) a detector for detecting the signal from the specimen yielded by the electron beam scanning;
   (h) display means in synchronization with the electron beam scanning for displaying a scanning image; and
   (i) means for supplying the signal corresponding to the ratio of the output signal of the detector and the output of the signal processing means to the display means as a scanning image signal.

2. A scanning electron microscope of claim 1, wherein the fluctuation detecting means (d) comprises an aperture plate arranged in the electron optical system and an amplifier for amplifying the current of the electron beam absorbed by the aperture plate.

3. A scanning electron microscope comprising:
   (a) an emitter tip maintained at voltage V0 for accelerating an electron beam passing through the anode;
   (b) an anode maintained at ground potential;
   (c) an extraction electrode maintained at voltage V1, being arranged between the emitter tip and the anode;
   (d) voltage ratio signal generator for generating the ratio signal r of acceleration voltage V0 and extraction voltage V1;
   (e) a signal converter for converting the ratio signal r to $G(r) = \propto \cdot I(r)$, where $\propto$ is constant, by using the previously stored signal level I(r) of the detected electron beam passing through the anode as a function of ratio signal r;
   (f) fluctuation detecting means for detecting the current intensity of the electron beam passing through the anode by using a detecting element arranged between the anode and a specimen to be irradiated by the electron beam and generating the signal E(r);
   (g) monitor signal generator for generating the signal of voltage ratio of the signal E(r) supplied from the fluctuation detecting means and the signal G(r) supplied from the signal converter;
   (h) an electron optical system for focusing the electron beam passing through the anode and scanning the electron beam over the specimen surface;
   (i) a detector for detecting the signal from the specimen yielded by the electron beam scanning;
   (j) a display means in synchronization with the electron beam scanning for displaying a scanning electron image; and
   (k) means for supplying the signal corresponding to the ratio of the output signal of the detector and the output of the monitor signal generator to the display means as a scanning image signal.

4. A scanning electron microscope comprising:
   (a) an emitter tip maintained at voltage V0 for accelerating an electron beam passing through the anode;
   (b) an anode maintained at ground potential;
   (c) an extraction electrode maintained at voltage V1, being arranged between the emitter tip and the anode;
   (d) voltage ratio signal generator for generating the ratio signal r of acceleration voltage V0 and extraction voltage V1;
   (e) comparator for comparing the signal of ratio signal r with the reference signal value;
   (f) signal converter for converting the ratio signal r to $G1(r) = \propto 1 \cdot I(r)$ or $G2(r) = \propto 2 \cdot I(r)$, where $\propto 1$ and $\propto 2$ are constant according to the output of the comparator by using the previously stored signal level I(r) of the detected electron beam passing through the anode as a function of ratio signal r;
   (g) fluctuation detecting means for detecting the current intensity of the electron beam passing through the anode by using a detecting element arranged between the anode and a specimen to be irradiated by the electron beam and generating the signal E1(r) or E2(r) (= k E1(r), L where $k = \propto 2 / \propto 1$), according to the output of the comparator;
   (h) monitor signal generating means for generating the signal of voltage ratio of E1(r) and G1(r) or the voltage ratio of E2(r) and G2(r);
   (i) an electron optical system for focusing the electron beam passing through the anode and scanning the electron beam over the specimen surface;
   (j) a detector for detecting the signal from the specimen caused by the electron beam scanning;
   (k) display means in synchronization with the electron beam scanning for displaying a scanning image; and
   (l) means for supplying the signal corresponding to the ratio of the output signal of the detector and the output of the monitor signal generator to the display means as a scanning image signal.

* * * * *

UNITED STATES PATENT AND TRADEMARK OFFICE
CERTIFICATE OF CORRECTION

PATENT NO. : 4,990,778
DATED : February 5, 1991
INVENTOR(S) : Setsuo Norioka

It is certified that error appears in the above-identified patent and that said Letters Patent is hereby corrected as shown below:

Column 1 Line 11 "know" should read --known--.

Column 1 Line 15 "decelerating;" should read --decelerating--.

Column 1 Lines 62-63 "Amperes - x$10^{-10}$" should read --Amperes - 1x$10^{-10}$--.

Column 3 Line 57 "convertor" should read --converter--.

Column 4 Line 25 "convertor" should read --converter--.

Column 4 Line 28 "(VC<r<Vs)" should read --(Vc <r <Vs)--.

Claim 4 (f) Line 36 Column 6 "constant" should read --constants--.

Claim 4 (g) Line 45 Column 6 before "where" delete --L--.

Claim 4 Line 48 Column 6 "(1)" should read --(l)--.

Signed and Sealed this

Fourteenth Day of July, 1992

*Attest:*

DOUGLAS B. COMER

*Attesting Officer*     *Acting Commissioner of Patents and Trademarks*